US010007138B2

(12) United States Patent
Jinnai et al.

(10) Patent No.: US 10,007,138 B2
(45) Date of Patent: Jun. 26, 2018

(54) LIQUID CRYSTAL DISPLAY DEVICE AND SUBSTRATE FOR DISPLAY DEVICE

(71) Applicant: Japan Display Inc., Minato-ku (JP)

(72) Inventors: Toshihide Jinnai, Tokyo (JP); Hirofumi Mizukoshi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 67 days.

(21) Appl. No.: 14/884,026

(22) Filed: Oct. 15, 2015

(65) Prior Publication Data

US 2016/0116791 A1     Apr. 28, 2016

(30) Foreign Application Priority Data

Oct. 24, 2014  (JP) ................................. 2014-216945

(51) Int. Cl.
*G02F 1/1343* (2006.01)
*G02F 1/1333* (2006.01)
*G02F 1/1362* (2006.01)
*H01L 27/12* (2006.01)

(52) U.S. Cl.
CPC .. *G02F 1/133345* (2013.01); *G02F 1/134363* (2013.01); *G02F 1/136286* (2013.01); *H01L 27/124* (2013.01); *H01L 27/1222* (2013.01); *G02F 2001/134372* (2013.01); *H01L 27/1255* (2013.01)

(58) Field of Classification Search
CPC ......... G02F 1/133345; G02F 1/134363; G02F 2001/134372; G02F 2001/134381; G02F 1/13685; G02F 1/136213
See application file for complete search history.

(56) References Cited

U.S. PATENT DOCUMENTS

| | | | |
|---|---|---|---|
| 6,266,116 B1 | 7/2001 | Ohta et al. | |
| 6,927,809 B2 | 8/2005 | Gotoh et al. | |
| 2001/0010575 A1 | 8/2001 | Yoshida et al. | |
| 2004/0165136 A1 | 8/2004 | Sugiyama et al. | |
| 2005/0162893 A1 | 7/2005 | Yagi et al. | |
| 2005/0206824 A1 | 9/2005 | Son et al. | |
| 2005/0219453 A1 | 10/2005 | Kubo et al. | |
| 2007/0097303 A1* | 5/2007 | Sonoda ............ | G02F 1/133345 349/122 |

(Continued)

FOREIGN PATENT DOCUMENTS

| | | |
|---|---|---|
| JP | 6-222397 | 8/1994 |
| JP | 7-159807 | 6/1995 |

(Continued)

*Primary Examiner* — Jessica M Merlin

(74) *Attorney, Agent, or Firm* — Oblon, McClelland, Maier & Neustadt, L.L.P.

(57) ABSTRACT

According to one embodiment, a display device includes a semiconductor layer, a first insulating film covering the semiconductor layer, a gate line extended in a first direction on the first insulating film to intersect the semiconductor layer, a second insulating film covering the gate line, a first common electrode formed on the second insulating film, a third insulating film covering the first common electrode, a source line which is extended in a second direction on the third insulating film and which is in contact with the semiconductor layer, and a fourth insulating film which covers the source line and which has a thickness greater than a thickness of the third insulating film.

18 Claims, 8 Drawing Sheets

(56) References Cited

U.S. PATENT DOCUMENTS

| | | |
|---|---|---|
| 2007/0115234 A1 | 5/2007 | Kim et al. |
| 2008/0062358 A1 | 3/2008 | Lee et al. |
| 2008/0180590 A1 | 7/2008 | Lee et al. |
| 2008/0180623 A1 | 7/2008 | Lee et al. |
| 2008/0186439 A1 | 8/2008 | Kwon et al. |
| 2008/0309841 A1 | 12/2008 | Yagi et al. |
| 2009/0014724 A1* | 1/2009 | Yamazaki ............ G02F 1/13454 257/59 |
| 2009/0153781 A1* | 6/2009 | Otani .................. G02B 5/3016 349/74 |
| 2009/0262270 A1 | 10/2009 | Kim et al. |
| 2010/0259703 A1* | 10/2010 | Song ................. G02F 1/133707 349/43 |
| 2011/0025937 A1 | 2/2011 | Yagi et al. |
| 2013/0329156 A1 | 12/2013 | Hirosawa |

FOREIGN PATENT DOCUMENTS

| | | |
|---|---|---|
| JP | 9-160041 | 6/1997 |
| JP | 9-160042 | 6/1997 |
| JP | 9-160061 | 6/1997 |
| JP | 10-26765 | 1/1998 |
| JP | 10-90708 | 4/1998 |
| JP | 2005-3802 | 1/2005 |
| JP | 3644653 | 5/2005 |
| JP | 2005-242307 | 9/2005 |
| JP | 2013-254052 | 12/2013 |

* cited by examiner

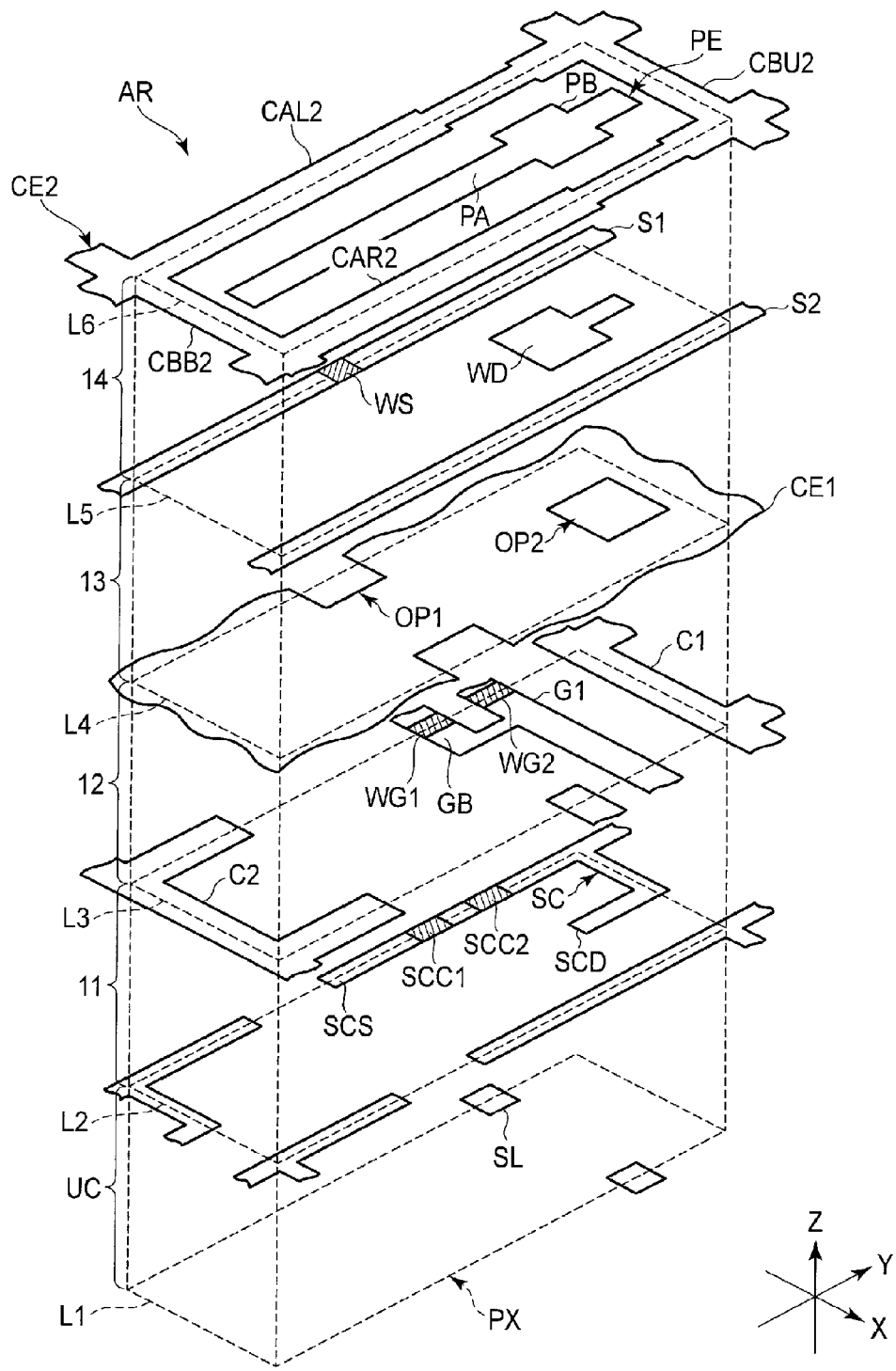
F I G. 3

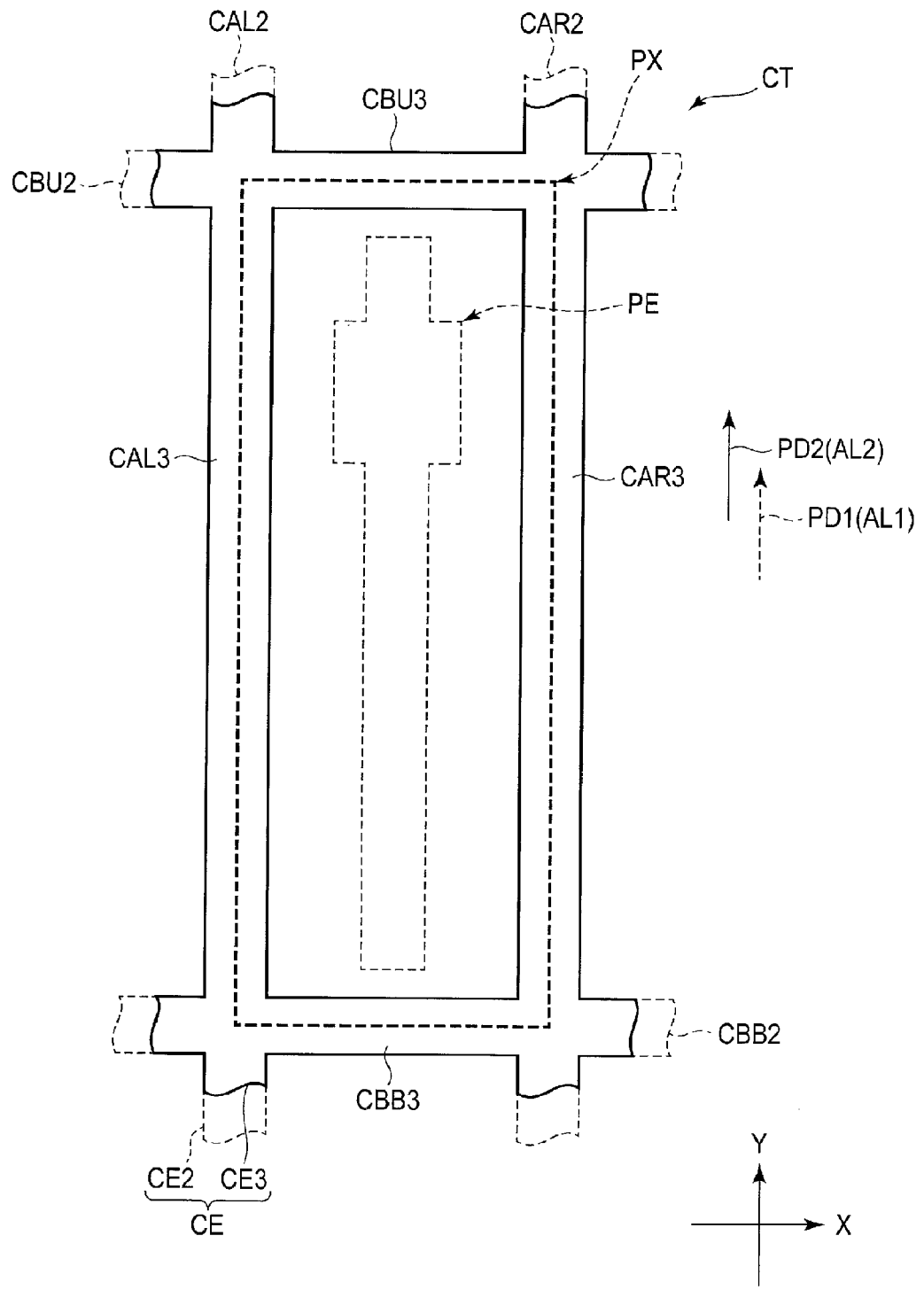
F I G. 5

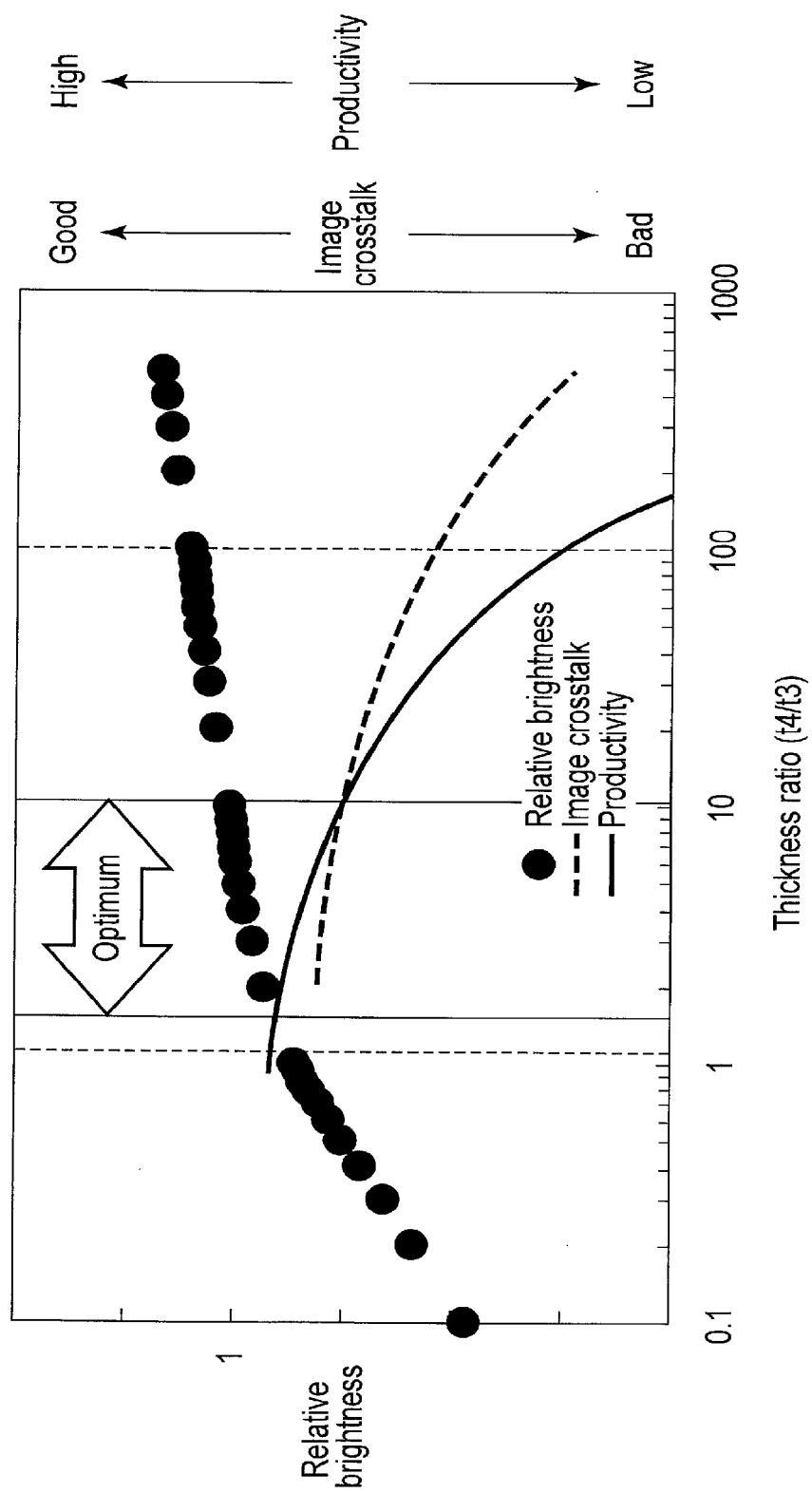
F I G. 7

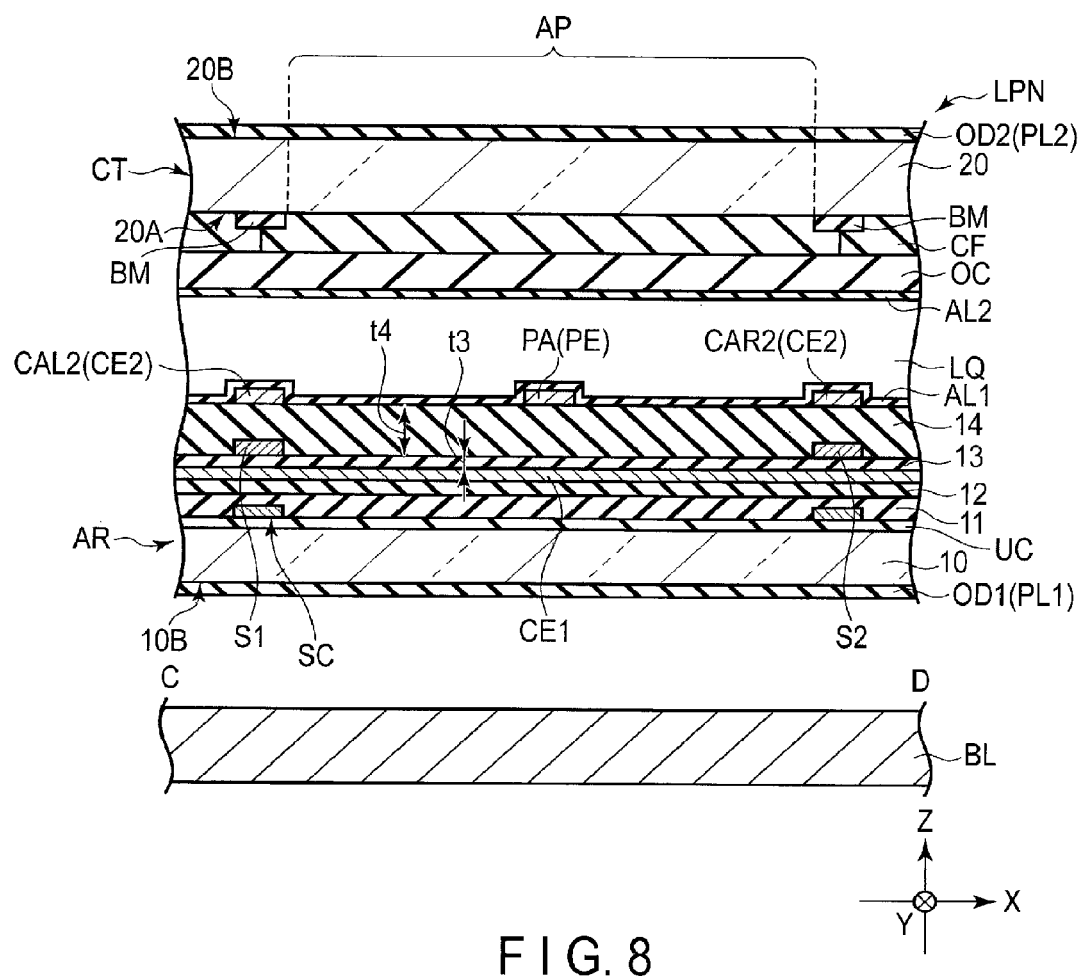
F I G. 8

LIQUID CRYSTAL DISPLAY DEVICE AND SUBSTRATE FOR DISPLAY DEVICE

CROSS-REFERENCE TO RELATED APPLICATIONS

This application is based upon and claims the benefit of priority from Japanese Patent Application No. 2014-216945, filed Oct. 24, 2014, the entire contents of which are incorporated herein by reference.

FIELD

Embodiments described herein relate generally to a liquid crystal display device and a substrate for the display device.

BACKGROUND

Recently, technology of controlling alignment of liquid crystal molecules by a lateral electric field or an oblique electric field formed between a pixel electrode and a common electrode, in an active-matrix-type liquid crystal display device comprising a switching element in each pixel has been proposed. More specifically, technology of arranging a double-layer pixel electrode between adjacent source lines to reduce the influence of the electric field from the source lines has been proposed.

BRIEF DESCRIPTION OF THE DRAWINGS

FIG. 3 is an exploded view schematically showing a major layered structure constituting the array substrate AR shown in FIG. 2.

FIG. 5 is a plan view schematically showing a configuration example of the pixel PX on the counter-substrate CT shown in FIG. 1.

FIG. 7 is a graph showing a result of simulating a relationship of a relative brightness with a thickness ratio between a third insulating film 13 and a fourth insulating film 14.

FIG. 8 is a cross-sectional view schematically showing another sectional structure of the liquid crystal display panel LPN as cut along line C-D in FIG. 2.

DETAILED DESCRIPTION

Figure 1:
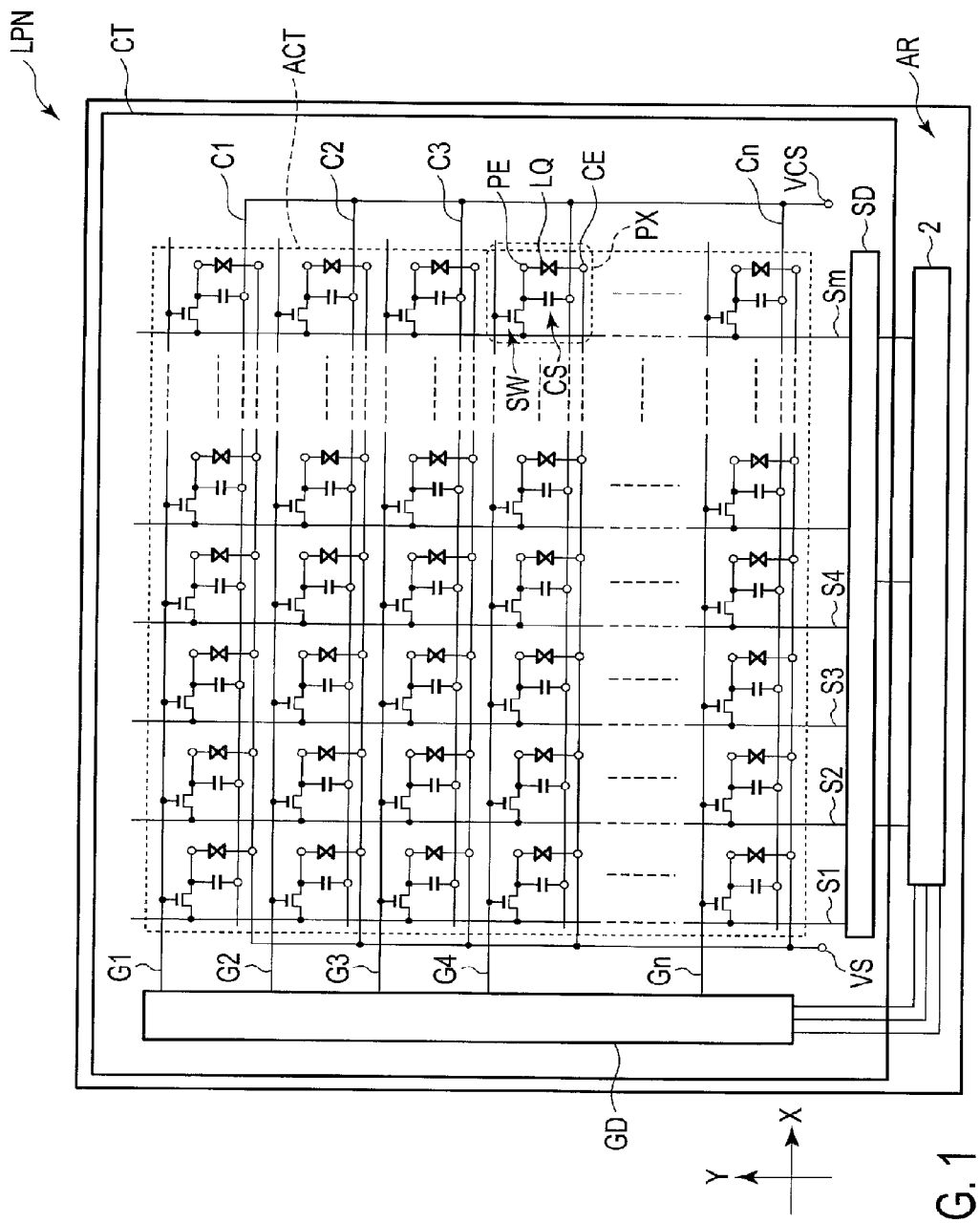
FIG. 1 is a view schematically showing a configuration and an equivalent circuit, of a liquid crystal display device of the present embodiment.

In general, according to one embodiment, a liquid crystal display device, includes: a first substrate comprising a semiconductor layer including a first region and a second region, a first insulating film covering the semiconductor layer, a gate line extended in a first direction on the first insulating film to intersect the semiconductor layer, a second insulating film covering the gate line, a first common electrode formed on the second insulating film, a third insulating film covering the first common electrode, a source line which is extended in a second direction intersecting the first direction on the third insulating film and which is in contact with the first region through a first contact hole penetrating the first to third insulating films, a drain electrode which is formed on the third insulating film and which is in contact with the second region through a second contact hole penetrating the first to third insulating films, a fourth insulating film which covers the source line and the drain electrode and which has a thickness greater than a thickness of the third insulating film, a pixel electrode which includes a main pixel electrode extended in the second direction on the fourth insulating film and which is in contact with the drain electrode through a third contact hole penetrating the fourth insulating film, a second common electrode which includes a second main common electrode extended in the second direction on the fourth insulating film and opposed to the source line, and which has a same potential as the first common electrode, and a first alignment film covering the pixel electrode and the second common electrode; a second substrate comprising a second alignment film opposed to the first alignment film; and a liquid crystal layer held between the first substrate and the second substrate.

According to another embodiment, a liquid crystal display device, includes: a first substrate comprising a semiconductor layer including a first region and a second region, a first insulating film covering the semiconductor layer, a gate line extended in a first direction on the first insulating film to intersect the semiconductor layer, a second insulating film covering the gate line, a first common electrode formed on the second insulating film, a third insulating film covering the first common electrode, a source line which is extended in a second direction intersecting the first direction on the third insulating film and which is in contact with the first region through a first contact hole penetrating the first to third insulating films, a drain electrode which is formed on the third insulating film and which is in contact with the second region through a second contact hole penetrating the first to third insulating films, a fourth insulating film which covers the source line and the drain electrode, a pixel electrode which includes a main pixel electrode extended in the second direction on the fourth insulating film and which is in contact with the drain electrode through a third contact hole penetrating the fourth insulating film, a second common electrode which includes a second main common electrode is extended in the second direction on the fourth insulating film and opposed to the source line, which includes a second main common electrode opposed to the source line, and which has a same potential as the first common electrode, and a first alignment film covering the pixel electrode and the second common electrode; a second substrate comprising a second alignment film opposed to the first alignment film; and a liquid crystal layer held between the first substrate and the second substrate, a relationship $t4 > (\in4/\in3)*t3$ being met where a thickness of the third insulating film is represented by $t3$, a relative dielectric constant of the third insulating film is represented by $\in3$, a thickness of the fourth insulating film is represented by $t4$, and a relative dielectric constant of the fourth insulating film is represented by $\in4$.

According to yet another embodiment, a substrate for a display device, the substrate includes: a semiconductor layer; a first insulating film covering the semiconductor layer; a gate line extended in a first direction on the first insulating film to intersect the semiconductor layer; a second insulating film covering the gate line; a first common electrode formed on the second insulating film; a third insulating film covering the first common electrode; a source line which is extended in a second direction intersecting the first direction on the third insulating film and which is in contact with the semiconductor layer through a first contact hole penetrating the first to third insulating films; and a fourth insulating film which covers the source line and which has a thickness greater than a thickness of the third insulating film.

One of the embodiments will be described hereinafter with reference to the accompanying drawings. The disclosure is a mere example, and arbitrary change of gist which can be easily conceived by a person of ordinary skill in the art naturally falls within the inventive scope. To better clarify the explanations, the drawings may schematically show width, thickness, shape, etc., of each portion as compared with the actual aspect, but they are mere examples and do not restrict the interpretation of the invention. In the present specification and drawings, elements like or similar to those in the already described drawings may be denoted by similar reference numbers and their detailed descriptions may be arbitrarily omitted.

FIG. 1 is a view schematically showing a configuration and an equivalent circuit, of a liquid crystal display device of the present embodiment.

The liquid crystal display device comprises an active-matrix-type liquid crystal display panel LPN. The liquid crystal display panel LPN comprises an array substrate AR which is a first substrate, a counter-substrate CT which is a second substrate disposed to be opposed to the array substrate AR, and a liquid crystal layer LQ held between the array substrate AR and the counter-substrate CT. The liquid crystal display panel LPN includes an active area ACT where an image is displayed. The active area ACT is constituted by a plurality of pixels PX arrayed in a matrix.

The liquid crystal display panel LPN includes a plurality of gate lines G (G1 to Gn), a plurality of storage capacitance lines C (C1 to Cn), a plurality of source lines S (S1 to Sm), etc., in the active area ACT. The gate lines G and the storage capacitance lines C are, for example, extended substantially linearly along a first direction X. The gate lines G and the storage capacitance lines C are adjacent and spaced apart from each other at intervals along a second direction Y intersecting the first direction X. The scanning lines G and the storage capacitance lines C are alternately arranged in the second direction Y. The first direction X and the second direction Y are perpendicular to each other. The source lines S are extended along the second direction Y and intersect the gate lines G and the storage capacitance lines C. The gate lines G, the storage capacitance lines C and the source lines S may not be extended linearly, but the lines may be bent in part.

Each of the gate lines G is led to the outside of the active area ACT and is electrically connected to a gate driver GD. Each of the source lines S is led to the outside of the active area ACT and is electrically connected to a source driver SD. At least some parts of the gate driver GD and the source driver SD are, for example, formed on the array substrate AR. The gate driver GD and the source driver SD are electrically connected with a driving IC chip 2 incorporating a controller.

Each of the pixels PX comprises a switching element SW, a pixel electrode PE, a common electrode CE, etc. A storage capacitor Cs is, for example, formed between the storage capacitance line C and the pixel electrode PE (or a semiconductor layer having the same potential as the pixel electrode). The storage capacitance line C is electrically connected to a voltage application module VCS to which an auxiliary capacitance voltage is applied.

The switching element SW is constituted by, for example, an n-channel thin film transistor (TFT). The switching element SW is electrically connected to the gate line G and the source line S. The switching element SW may be in a top-gate type or a bottom-gate type.

The pixel electrode PE is disposed in each pixel PX and electrically connected to the switching element SW. The common electrode CE is disposed over the pixels PX. The common electrode CE is set at, for example, a common potential and is opposed to the pixel electrodes PE via the liquid crystal layer LQ. A power supply module VS is, for example, formed outside the active area ACT on the array substrate AR. The common electrode CE is led to the outside of the active area ACT and is electrically connected with the power supply module VS.

In the liquid crystal display panel LPN of the present embodiment, the array substrate AR includes the pixel electrode PE, and the array substrate AR or the counter-substrate CT includes at least a part of the common electrode CE. Alignment of the liquid crystal modules contained in the liquid crystal layer LQ is controlled by an electric field formed between the pixel electrode PE and the common electrode CE. The electric field formed between the pixel electrode PE and the common electrode CE is an electric field slightly inclined to an X-Y plane (or a main surface of the substrate) defined by the first direction X and the second direction Y (or lateral electric field substantially parallel to the main surface of the substrate).

Figure 2:
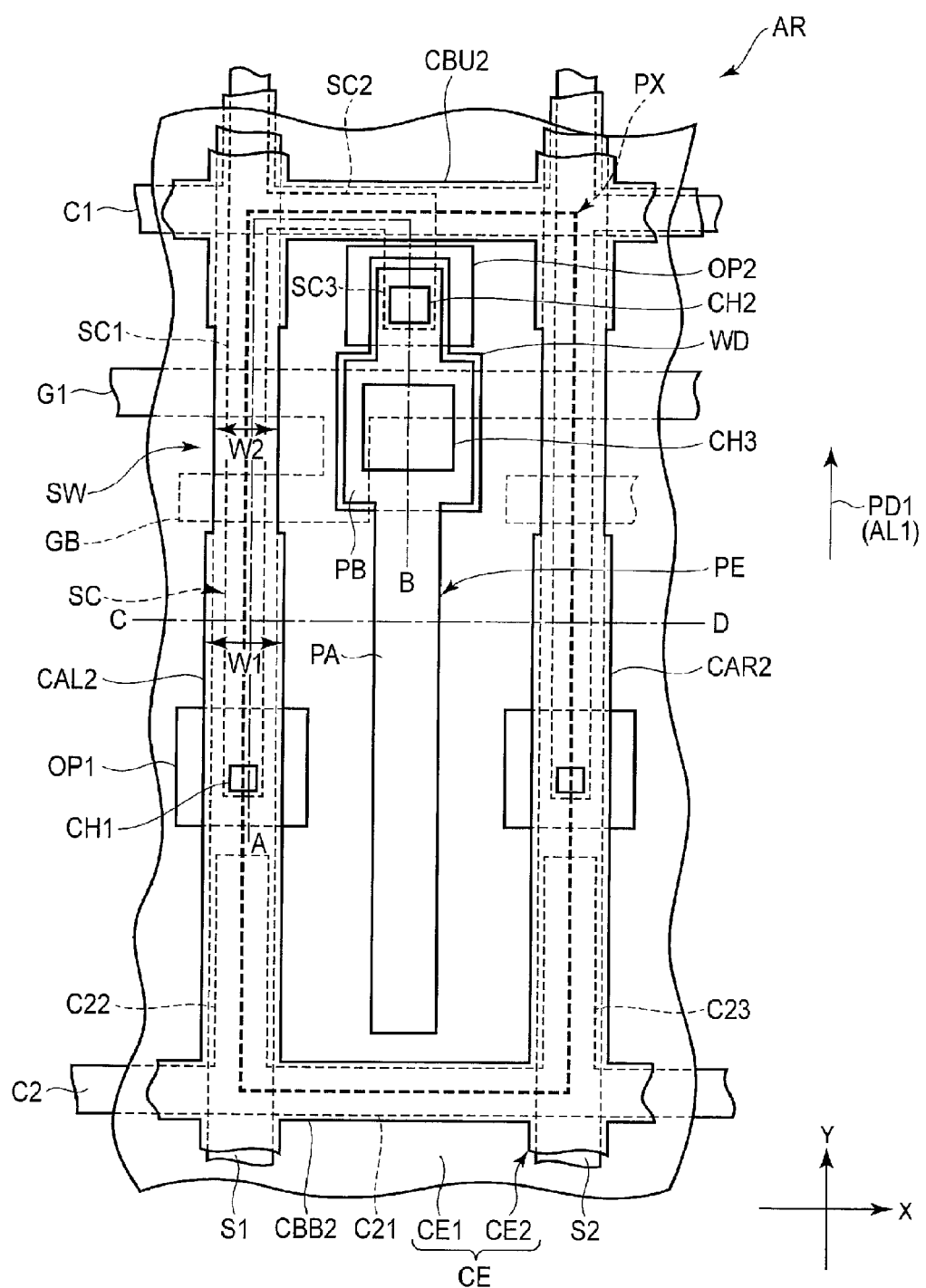
FIG. 2 is a plan view schematically showing a configuration example of a pixel PX in a state in which the array substrate AR shown in FIG. 1 is seen from a counter-substrate side.

FIG. 2 is a plan view schematically showing a configuration example of a pixel PX in a state in which the array substrate AR shown in FIG. 1 is seen from a counter-substrate side. A plan view in the X-Y plane is illustrated here.

The array substrate AR comprises a gate line G1, a storage capacitance line C1, a storage capacitance line C2, a source line S1, a source line S2, a switching element SW, a first common electrode CE1 and a second common electrode CE2 implied in the common electrodes CE, a first alignment film AL1, etc.

The storage capacitance line C1 and the storage capacitance line C2 are designed to be in the same shape and are spaced apart from each other at intervals along the second direction Y. Each of the storage capacitance line C1 and the storage capacitance line C2 is extended along the first direction X. In the example illustrated, the storage capacitance line C2 includes a first portion C21, a second portion C22 and a third portion C23. The first portion C21 is extended in the first direction X. The second portion C22 is continuous with the first portion C21, opposed to the source line S1, and extended toward the gate line G1 in the second direction Y. The third portion C23 is continuous with the first portion C21, opposed to the source line S2, and extended toward the gate line G1 in the second direction Y. The storage capacitance line C1 is designed similarly to the storage capacitance line C2 though it is not explained in detail.

The gate line C1 is located between the storage capacitance line C1 and the storage capacitance line C2 and is extended along the first direction X. The gate line G1 is closer to the storage capacitance line C1 than to the storage capacitance line C2. In other words, an interval along the second direction Y between the gate line G1 and the storage capacitance line C1 is less than the interval along the second direction Y between the gate line G1 and the storage capacitance line C2. A branch portion GB is formed in an L-shape and continuous with the gate line G1 inside the pixel PX. In the example illustrated, the branch portion GB is located on the storage capacitance line C2 side in view of the gate line G1.

The source line S1 and the source line S2 are spaced apart from each other along the first direction X. Each of the source line S1 and the source line S2 is extended along the second direction Y.

In the example illustrated, the pixel PX corresponds to a region of a frame formed by the storage capacitance line C1, the storage capacitance line C2, the source line S1 and the source line S2, and is rectangular in shape having a dimension along the first direction X shorter than a dimension along the second direction Y, as represented by a broken line in the drawing. The dimension of the pixel PX along the first direction X corresponds to a pitch along the first direction X between the source line S1 and the source line S2. The dimension of the pixel PX along the second direction Y corresponds to a pitch along the second direction Y between the storage capacitance line C1 and the storage capacitance line C2.

In the pixel PX illustrated, the source line S1 is located at a left end portion and is disposed across a boundary between the pixel PX and a pixel adjacent to a left side of the pixel PX. The source line S2 is located at a right end portion of the pixel PX and is disposed across a boundary between the pixel PX and a pixel adjacent to a right side of the pixel PX. The storage capacitance line C1 is located at an upper end portion of the pixel PX and is disposed across a boundary between the pixel PX and a pixel adjacent to an upper side of the pixel PX. The storage capacitance line C2 is located at a lower end portion of the pixel PX and is disposed across a boundary between the pixel PX and a pixel adjacent to a lower side of the pixel PX. The gate line G1 is disposed to cross the pixel PX.

The switching element SW is electrically connected with the gate line G1 and the source line S1. In the example illustrated, the switching element SW has a double-gate structure. The switching element SW comprises a semiconductor layer SC and a drain electrode WD. The drain electrode WD is in the form of an island and is disposed inside the pixel PX.

The semiconductor layer SC is disposed to be opposed to the source line S1 and the storage capacitance line C1 and is extended in part to the inside of the pixel PX. One of end sides of the semiconductor layer SC is electrically connected with the source line S1 through a first contact hole CH1. The other end side of the semiconductor layer SC is electrically connected with the drain electrode WD through a second contact hole CH2.

More specifically, the semiconductor layer SC comprises a first extended portion SC1, a second extended portion SC2 and a third extended portion SC3. The first extended portion SC1 is opposed to the source line S1 and extended in the second direction Y. The first extended portion SC1 is extended in the second direction Y, from a position which overlaps the first contact hole CH1 beyond a position which intersects the storage capacitance line C1. In other words, the first extended portion SC1 is extended over the pixel PX illustrated and the other pixel adjacent to the pixel PX in the second direction Y. The first extended portion SC1 intersects the gate line G1 and the branch portion GB, between the position which overlaps the first contact hole CH1 and the position which intersects the storage capacitance line C1. The second extended portion SC2 is continuous with the first extended portion SC1, opposed to the storage capacitance line C1, and extended in the first direction X. The third extended portion SC3 is continuous with the second extended portion SC2 and extended toward the gate line G1 in the second direction Y.

The drain electrode WD is electrically connected with the third extended portion SC3 through the second contact hole CH2, at a position opposed to the third extended portion SC3. The drain electrode WD is extended in the second direction Y, from a position which overlaps the second contact hole CH2 toward a position which is opposed to the gate line G1.

The pixel electrode PE is located between the source line S1 and the source line S2, and also located between the storage capacitance line C1 and the storage capacitance line C2. The pixel electrode PE comprises a main pixel electrode PA and a sub-pixel electrode PB. The main pixel electrode PA and the sub-pixel electrode PB are formed integrally or successively, and electrically connected with each other. The pixel electrode PE illustrated is formed in substantially a cross shape.

The main pixel electrode PA is located substantially at a middle position between the source line S1 and the source line S2, and extended in the second direction Y between the vicinity of the upper end portion of the pixel PX (i.e., the vicinity of the storage capacitance line C1) and the vicinity of the lower end portion of the pixel PX (i.e., the vicinity of the storage capacitance line C2). The main pixel electrode PA is in the form of a stripe having a substantially uniform width along the first direction X. The sub-pixel electrode PB is extended in the first direction X, between a vicinity of the left end portion of the pixel PX (i.e., the vicinity of the source line S1) and the vicinity of the right end portion of the pixel PX (i.e., the vicinity of the source line S2). The sub-pixel electrode PB is opposed to the drain electrode WD at a position where the drain electrode WD is opposed to the gate line G1, and is electrically connected with the drain electrode WD through a third contact hole CH3.

The first common electrode CE1 is disposed over substantially the entire body of the pixel PX and is opposed to the pixel electrode PE. More specifically, the first common electrode CE1 is opposed to the source line S1 and the source line S2. The first common electrode CE1 is extended along the first direction X, over the source line S1 and the source line S2, and is also disposed in a pixel adjacent to the pixel PX in the first direction X. The first common electrode CE1 is also extended between the source line S1 and the source line S2, and is opposed to the pixel electrode PE. The first common electrode CE1 is opposed to the gate line G1, the storage capacitance line C1, and the storage capacitance line C2. The first common electrode CE1 is extended along the second direction Y, over the storage capacitance line C1 and the storage capacitance line C2, and is also disposed in a pixel adjacent to the pixel PX in the second direction Y. The first common electrode CE1 is also extended between the gate line C1 and the storage capacitance line C1, and between the gate line G1 and the storage capacitance line C2. In the first common electrode CE1, a first opening portion OP1 through which the semiconductor layer SC and the source line S1 are electrically connected with each other, a second opening portion OP2 through which the semiconductor layer SC and the drain electrode WD are electrically connected with each other, etc., are formed. The first opening portion OP1 is formed in a region including the first contact hole CH1. The second opening portion OP2 is formed in a region including the second contact hole CH2. The second opening portion OP2 and the second contact hole CH2 are located between the gate line C1 and the storage capacitance line C1.

The second common electrode CE2 comprises a second main common electrode CAL2, a second main common electrode CAR2, a second sub-common electrode CBU2 and a second sub-common electrode CBB2. The second main common electrode CAL2, the second main common electrode CAR2, the second sub-common electrode CBU2 and the second sub-common electrode CBB2, are formed integrally or successively, and are electrically connected with each other. In other words, the second common electrode CE2 is formed in a lattice shape to partition the pixel PX. The second common electrode CE2 is spaced apart from the pixel electrode PE and surrounds the pixel electrode PE. The first common electrode CE1 and the second common electrode CE2 are electrically connected with each other at the same potential, and are electrically connected with the power supply module VS outside the active area ACT.

Each of the second main common electrode CAL2 and the second main common electrode CAR2 is extended in the second direction Y and is in the form of a stripe having a substantially uniform width along the first direction X. In the example illustrated, the second main common electrode CAL2 is located at the left end portion of the pixel PX, disposed across a boundary between the pixel PX and a pixel adjacent to a left side of the pixel PX, and opposed to the source line S1. The second main common electrode CAR2 is located at the right end portion of the pixel PX, disposed across a boundary between the pixel PX and a pixel adjacent to a right side of the pixel PX, and opposed to the source line S2. In the example illustrated, the second main common electrode CAL2 has a first width W1 at a position where the second main common electrode CAL2 is aligned with the main pixel electrode PA in the first direction X, and a second width W2 at a position where the second main common electrode CAL2 is aligned with the sub-pixel electrode PB in the first direction X. The second width W2 is less than the first width W1. Each of the first width W1 and the second width W2 is a dimension along the first direction X. The second main common electrode CAR2 is designed similarly to the second main common electrode CAL2 though it is not explained in detail.

Each of the second sub-common electrode CBU2 and the second sub-common electrode CBB2 is extended in the first direction X and is in the form of a stripe having a substantially uniform width along the second direction Y. In the example illustrated, the second sub-common electrode CBU2 is located at the upper end portion of the pixel PX, disposed across a boundary between the pixel PX and a pixel adjacent to the upper side of the pixel PX, and opposed to the storage capacitance line C1. The second sub-common electrode CBB2 is located at the lower end portion of the pixel PX, disposed across a boundary between the pixel PX and a pixel adjacent to the lower side of the pixel PX, and opposed to the storage capacitance line C2.

In the array substrate AR, the pixel electrode PE and the second common electrode CE2 are covered with the first alignment film AL1. The first alignment film AL1 is subjected to alignment along a first alignment direction PD1 to initially align the liquid crystal molecules of the liquid crystal layer LQ. The first alignment direction PD1 is substantially parallel to the second direction Y.

FIG. 3 is an exploded view schematically showing a major layered structure constituting the array substrate AR shown in FIG. 2. A major conductive layer in the array substrate AR is illustrated in the drawing.

The array substrate AR comprises a first layer L1, a second layer L2, a third layer L3, a fourth layer L4, a fifth layer L5 and a sixth layer L6 along a third direction Z perpendicular to the X-Y plane. In addition, the array substrate AR comprises an underlayer insulating film UC located between the first layer L1 and the second layer L2, a first insulating film 11 located between the second layer L2 and the third layer L3, a second insulating film 12 located between the third layer L3 and the fourth layer L4, a third insulating film 13 located between the fourth layer L4 and the fifth layer L5, and a fourth insulating film 14 located between the fifth layer L5 and the sixth layer L6.

The first layer L1 includes a light-shielding layer SL. The light-shielding layer SL is in the form of an island and is located on a longer edge of the pixel PX. The light-shielding layer SL is covered with the underlayer insulating film UC.

The second layer L2 is located between the underlayer insulating film UC and the first insulating film 11. The second layer L2 includes the semiconductor layer SC of the switching element. The semiconductor layer SC is extended along the longer edge of the pixel PX, under the source line S1, and intersect the gate line G1 and the branch portion GB. The semiconductor layer SC is extended along the shorter edge of the pixel PX, under the storage capacitance line C1, and further extended toward the inner side of the pixel PX. In the semiconductor layer SC, a region located directly under the branch portion GB corresponds to a first channel region SCC1, a region located directly under the gate line G1 corresponds to a second channel region SCC2, a region on a side of being in contact with the source line S1 rather than the first channel region SCC1 corresponds to a first region (source region) SCS, and a region on a side extending under the drain electrode WD rather than the second channel region SCC2 corresponds to a second region (drain region) SCD. The second channel region SCC2 is located directly above the light-shielding layer SL. In the example illustrated, the light-shielding film LS is disposed at a portion opposed to the second channel region SCC2. The light-shielding film LS may be disposed at a portion opposed to the first channel region SCC1, a portion opposed to each of the first channel region SCC1 and the second channel region SCC2, or a portion opposed integrally to both the first channel region SCC1 and the second channel region SCC2.

The third layer L3 is located between the first insulating film 11 and the second insulating film 12. The third layer L3 includes the storage capacitance line C1, the gate line G1, and the storage capacitance line C2. The storage capacitance line C1 is extended in the first direction X and is opposed to a part of the semiconductor layer SC via the first insulating film 11. The gate line G1 is extended in the first direction X to intersect the semiconductor layer SC. The branch portion GB intersects the semiconductor layer SC. A region of the branch portion GB, which is located above the semiconductor layer SC, corresponds to the first gate electrode WG1 of the switching element. A region of the gate line G1, which is located above the semiconductor layer SC, corresponds to the second gate electrode WG2 of the switching element. The storage capacitance line C1, the storage capacitance line C2 and the gate line G1 can be formed of the same wiring material at a time.

The fourth layer L4 is located between the second insulating film 12 and the third insulating film 13. The fourth layer L4 includes the first common electrode CE1. The first common electrode CE1 is disposed over substantially the entire body of the pixel PX and is opposed to the first common electrode CE1, the gate line G1, and the storage capacitance line C2 via the second insulating film 12. The first common electrode CE1 is opposed to the semiconductor layer SC, between the storage capacitance line C1 and the gate line G1, between the gate line G1 and the branch portion GB, and between the branch portion GB and the storage capacitance line C2. The first common electrode CE1 comprises the first opening portion OP1 formed at a position opposed to the first region SCS and the second opening portion OP2 formed at a position opposed to the second region SCD.

The fifth layer L5 is located between the third insulating film 13 and the fourth insulating film 14. The fifth layer L5 includes the source line S1, the source line S2, and the drain electrode WD. The source line S1 and the source line S2 are extended in the second direction Y. A region of the source line S1, which is in contact with the first region SCS of the semiconductor layer SC, corresponds to the source electrode WS of the switching element. The drain electrode WD is located between source line S1 and source line S2 and is in the form of an island. The source line S1, the source line S2 and the drain electrode WD can be formed of the same wiring material at a time.

The sixth layer L6 is located on the fourth insulating film 14 and includes the second common electrode CE2 and the pixel electrode PE. The second main common electrode CRL2 is located above the source line S1. The second main common electrode CAR2 is located above the source line S2. The second sub-common electrode CBU2 is located above the storage capacitance line C1. The second sub-common electrode CBB2 is located above the storage capacitance line C2. The pixel electrode PE is opposed to the first common electrode CE1 via the third insulating film 13 and the fourth insulating film 14. The sub-pixel electrode PB is opposed to the drain electrode WD via the fourth insulating film 14. The second common electrode CE2 and the pixel electrode PE can be formed of the same material at a time.

Figure 4:
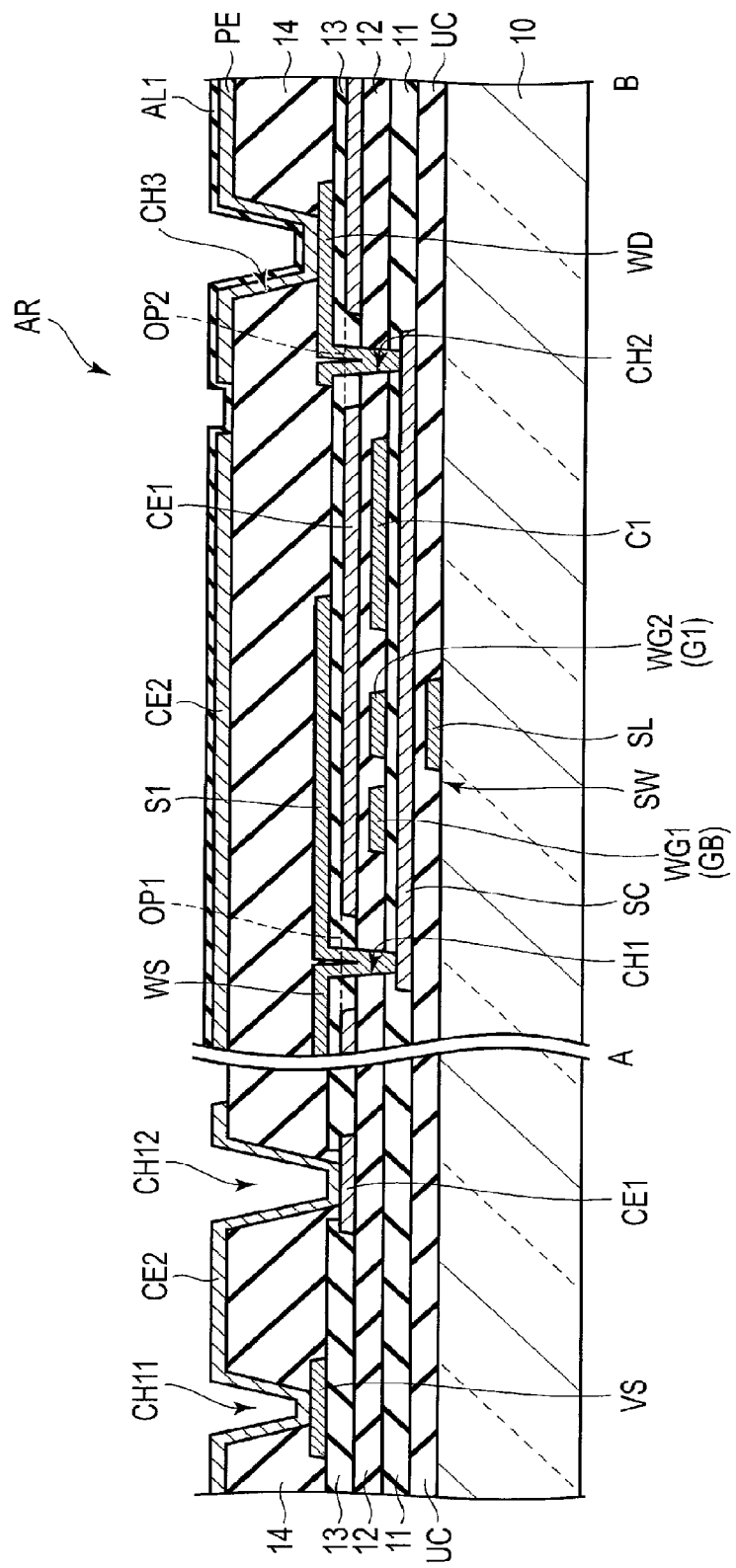
FIG. 4 is a cross-sectional view schematically showing a sectional structure of the array substrate AR as cut along an A-B line in FIG. 2.

FIG. 4 is a cross-sectional view schematically showing a sectional structure of the array substrate AR as cut along an A-B line in FIG. 2.

The array substrate AR is formed by using a first insulating substrate 10 having a light transmitting property such as a glass substrate or a resin substrate. The array substrate AR comprises the light-shielding layer SL, the semiconductor layer SC, the branch portion GB, the gate line G1, the storage capacitance line C1, the first common electrode CE1, the source line S1, the drain electrode WD, the pixel electrode PE, the second common electrode CE2, the underlayer insulating film UC, a first insulating film 11, a second insulating film 12, a third insulating film 13, a fourth insulating film 14, a first alignment film AL1, etc., on an inner side of the first insulating substrate 10, i.e., the side of the first insulating substrate 10, which is opposed to the counter-substrate CT.

The light-shielding layer SL is formed on the first insulating substrate 10 and coated with the underlayer insulating film UC. The light-shielding layer SL is formed of, for example, molybdenum (Mo), etc. The underlayer insulating film UC is formed of, for example, a transparent inorganic material such as silicon nitride (SiN) and silicon oxide (SiO). For example, the underlayer insulating film UC is formed of a multilayer film formed by stacking a silicon nitride and a silicon oxide.

The semiconductor layer SC is formed on the underlayer insulating film UC and coated with the first insulating film 11. The semiconductor layer SC is formed of, for example, polycrystalline silicon (p-Si) but may be formed of amorphous silicon (a-Si) or the like. The first insulating film 11 is formed of, for example, an inorganic material such as tetraethyl orthosilicate (TEOS).

The branch portion GB including the first gate electrode WG1, the gate line G1 including the second gate electrode WG2, and the storage capacitance line C1 are formed on the first insulating film 11 and covered with the second insulating film 12. The branch portion GB, the gate line G1, and the storage capacitance line C1 are formed of, for example, a wiring material such as aluminum (Al), titanium (Ti), silver (Ag), molybdenum (Mo), tungsten (W), copper (Cu) or chromium (Cr). The second insulating film 12 is formed of, for example, an inorganic material such as silicon nitride. For example, the branch portion GB, the gate line G1, and the storage capacitance line C1 are formed of a molybdenum-tungsten (MoW) alloy.

The first common electrode CE1 is formed on the second insulating film 12 and is covered with the third insulating film 13. The first common electrode CE1 is formed of, for example, a transparent conductive material such as indium tin oxide (ITO) or indium zinc oxide (IZO). The third insulating film 13 is formed of, for example, an inorganic material such as silicon oxide. The third insulating film 13 may be constituted by not only a single-layer film of silicon oxide, but also a multilayer film formed by stacking two or more insulating film layers.

The source line S1 including the source electrode WS, and the drain electrode WD are formed on the third insulating film 13 and are covered with the fourth insulating film 14. The first common electrode CE1 is interposed between the source line S1 and the semiconductor layer SC. The source electrode WS is in contact with the semiconductor layer SC through the first contact hole CH1 that penetrates the first insulating film 11, the second insulating film 12, and the third insulating film 13, via the first opening portion OP1 of the first common electrode CE1. The drain electrode WD is in contact with the semiconductor layer SC through the second contact hole CH2 that penetrates the first insulating film 11, the second insulating film 12, and the third insulating film 13, via the second opening portion OP2 of the first common electrode CE1. The source line S1 and the drain electrode WD are formed of, for example, a wiring material such as aluminum (Al), titanium (Ti), silver (Ag), molybdenum (Mo), tungsten (W), copper (Cu) or chromium (Cr). For example, the source line S1 and the drain electrode WD are formed of a laminate of an aluminum-silicon (AlSi) alloy and titanium. The fourth insulating film 14 is formed of, for example, an organic material of various types of resin, but may be formed of an inorganic material instead of an organic material. The first contact hole CH1 and the second contact hole CH2 can be fully formed in one etching step by forming the first to third insulating films and then defining positions of the respective contact holes in one photolithographic step.

The second common electrode CE2 and the pixel electrode PE are formed on the fourth insulating film 14 and covered with the first alignment film AL1. The pixel electrode PE is in contact with the drain electrode WD through the third contact hole CH3 which penetrates the fourth insulating film 14. The second common electrode CE2 and the pixel electrode PE are formed of, for example, a transparent, electrically conductive material such as ITO or IZO.

The second common electrode CE2 is electrically connected with the power supply module VS together with the first common electrode CE1, on the outer side of the active area. For example, the power supply module VS is formed on the third insulating film 13 and is covered with the fourth insulating film 14. The second common electrode CE2 is electrically connected with the power supply module VS through the contact hole CH1 which penetrates the fourth insulating film 14. In addition, the second common electrode CE2 is electrically connected with the first common electrode CE1 through the contact hole CH12 which penetrates the third insulating film 13 and the fourth insulating film 14. A portion of the contact hole CH12, which penetrates the third insulating film 13, can be simultaneously formed in the process of forming the first contact hole CH1, etc.

FIG. 5 is a plan view schematically showing a configuration example of the pixel PX on the counter-substrate CT shown in FIG. 1. A plan view in the X-Y plane is illustrated here. The constituent elements necessary for the explanations are illustrated alone, and the pixel electrode PE and the second common electrode CE2 alone of the array substrate are represented by broken lines.

The counter-electrode CT comprises a third common electrode CE3 included in the common electrodes CE. The third common electrode CE3 comprises a third main common electrode CAL3, a third main common electrode CAR3, a third sub-common electrode CBU3 and a third sub-common electrode CBB3. The third main common electrode CAL3, the third main common electrode CAR3, the third sub-common electrode CBU3 and the third sub-common electrode CBB3, are formed integrally or successively, and are electrically connected with each other. In other words, the third common electrode CE3 is formed in a lattice shape to partition the pixel PX. The third common electrode CE3 is formed of, for example, a transparent, electrically conductive material such as ITO or IZO. The third common electrode CE3 is electrically connected with the first common electrode CE1 and the second common electrode CE2, and has the same potential as the first common electrode CE1 and the second common electrode CE2.

Each of the third main common electrode CAL3 and the third main common electrode CAR3 is extended in the second direction Y and is in the form of a stripe having a substantially uniform width along the first direction X. In the example illustrated, the third main common electrode CAL3 is located at the left end portion of the pixel PX, disposed across a boundary between the pixel PX and a pixel adjacent to a left side of the pixel PX, and opposed to the second main common electrode CAL2. The third main common electrode CAR3 is located at the right end portion of the pixel PX, disposed across a boundary between the pixel PX and a pixel adjacent to a right side of the pixel PX, and opposed to the second main common electrode CAR2.

Each of the third sub-common electrode CBU3 and the third sub-common electrode CBB3 is extended in the first direction X and is in the form of a stripe having a substantially uniform width along the second direction Y. In the example illustrated, the third sub-common electrode CBU3 is located at the upper end portion of the pixel PX, disposed across a boundary between the pixel PX and a pixel adjacent to the upper side of the pixel PX, and opposed to the second sub-common electrode CBU2. The third sub-common electrode CBB3 is located at the lower end portion of the pixel PX, disposed across a boundary between the pixel PX and a pixel adjacent to the lower side of the pixel PX, and opposed to the second sub-common electrode CBU2.

In the counter-substrate CT, the third common electrode CE3 is covered with the second alignment film AL2. The second alignment film AL2 is subjected to alignment along a second alignment direction PD2 to initially align the liquid crystal molecules of the liquid crystal layer LQ. The second alignment direction PD2 is parallel to the first alignment direction PD1. In the example illustrated, the second alignment direction PD2 is the same as the first alignment direction PD1. The first alignment direction PD1 and the second alignment direction PD2 may be opposite to each other.

Figure 6:
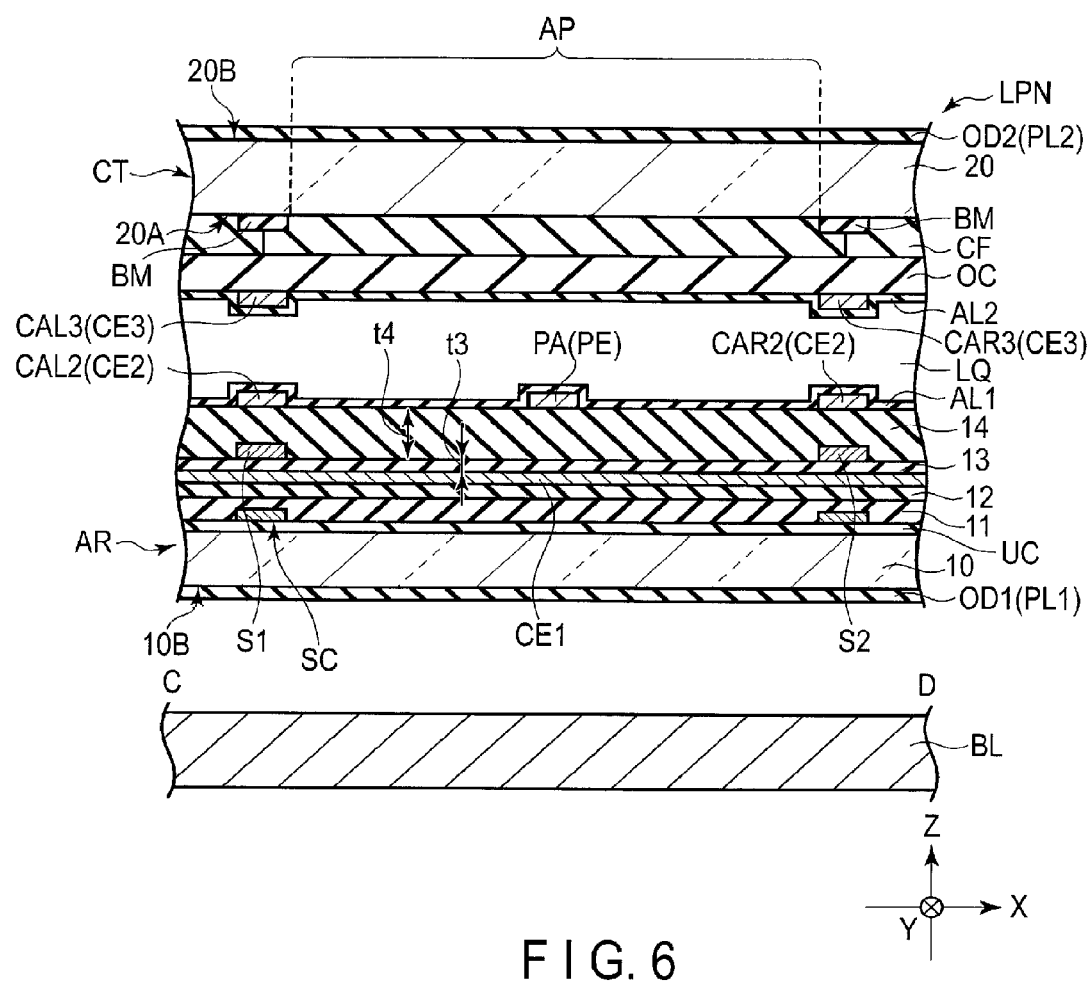
FIG. 6 is a cross-sectional view schematically showing a sectional structure of the liquid crystal display panel LPN as cut along line C-D in FIG. 2.

FIG. 6 is a cross-sectional view schematically showing a sectional structure of the liquid crystal display panel LPN as cut along line C-D in FIG. 2.

A backlight unit BL to illuminate the liquid crystal display panel LPN is disposed on a back surface side of the array substrate AR. In the present embodiment, various types of backlight units BL can be applied. Explanations of the detailed structure of the backlight unit BL are omitted here.

The array substrate AR comprises the semiconductor layer SC, the source line S1, the source line S2, the pixel electrode PE, the first common electrode CE1, the second common electrode CE2, the underlayer insulating film UC, the first insulating film 11, the second insulating film 12, the third insulating film 13, the fourth insulating film 14, the first alignment film AL1, etc., on the inner side of the first insulating substrate 10. Details of the array substrate AR have been explained with reference to FIG. 4.

The first alignment film AL1 is disposed on a surface of the array substrate AR which is opposed to the counter-substrate CT, and is extended over substantially the entire body of the active area ACT. The first alignment film AL1 is also disposed on the fourth insulating film 14. The first alignment film AL1 is formed of a material having a horizontal alignment property.

The counter-substrate CT is formed by using the second insulating substrate 20 having a light transmitting property. The counter-substrate CT comprises a black matrix BM, color filters CF, an overcoat layer OC, the third common element CE3, the second alignment film AL2, etc., on an inner side of the second insulating substrate 20, i.e., a side of the second insulating substrate 20 which is opposed to the array substrate AR.

The black matrix BM partitions pixels PX and forms an opening portion AP opposed to the pixel electrode PE. The black matrix BM is disposed to be opposed to the source lines, the storage capacitance lines, and a wiring portion of the switching element SW. In the example illustrated, the black matrix BM comprises a portion located above the source line S1 and the source line S2 and extended along the second direction Y. The black matrix BM is disposed on an inner surface 20A of the second insulating substrate 20, which is opposed to the array substrate AR.

The color filters CF are disposed on an inner side (opening portion AP) partitioned by the black matrix BM on the inner surface 20A of the second insulating substrate 20, and are superposed in part on the black matrix BM. The color filters CF disposed on the respective pixels PX adjacent in the first direction X are different in color from each other. For example, the color filters CF are formed of resin materials colored red, blue and green, respectively. A red color filter formed of the red resin material is disposed to correspond to the red pixel. A blue color filter formed of the blue resin material is disposed to correspond to the blue pixel. A green color filter formed of the green resin material is disposed to correspond to the green pixel. The color filters CF may further include color filters of colors different from red, blue and green, for example, a transparent or white color filter. Each boundary between the color filters CF is located at a position overlapping the black matrix BM. In addition, the color filter CF of each color is extended over the pixels adjacent to each other in the second direction Y.

The overcoat layer OC covers the color filters CF. The overcoat layer OC is formed of, for example, a transparent resin material.

The third counter electrode CE3 is formed on a side of the overcoat layer OC, which is opposed to the array substrate AR, and located under the black matrix BM. In the example illustrated, the third main common electrode CAL3 of the third common electrode CE3 is opposed to the second main common electrode CAL2, and the third main common electrode CARS of the third common electrode CE3 is opposed to the second main common electrode CAR2.

In the region of the opening portion AP between the pixel electrode PE, and the second common electrode CE2 and the third common electrode CE3, except the region intersecting the gate line G1, the other electrodes or interconnects are not formed, and the region corresponds to a transmissive region through which the backlight can be transmitted.

The second alignment film AL2 is disposed on a surface of the counter-substrate CT, which is opposed to the array substrate AR, and extended over substantially the entire body of the active area ACT. The second alignment film AL2 covers the third common electrode CE3 and the overcoat layer OC. The second alignment film AL2 is formed of a material having a horizontal alignment property.

The array substrate AR and the counter-substrate CT as explained above are disposed to each other in a manner in which the first alignment film AL1 and the second alignment film AL2 are opposed to each other. The array substrate AR or the counter-substrate CT comprises a columnar spacer. The columnar spacer is formed of, for example, a resin material. The columnar spacer is located between the array substrate AR and the counter-substrate CT, and forms a predetermined gap between the first alignment film AL1 and the second alignment film AL2. The cell gap has a length of, for example, 2 to 7 μm. The array substrate AR and the counter-substrate CT are bonded to each other, on the outer side of the active area ACT, by a sealing member in a state in which the cell gap is formed.

The liquid crystal layer LQ is held between the array substrate AR and the counter-substrate CT and disposed between the first alignment film AL1 and the second alignment film AL2. The liquid crystal layer LQ includes liquid crystal molecules LM. The liquid crystal layer LQ is constituted by, for example, a liquid crystal material of a positive dielectric anisotropy, but may be constituted by a liquid crystal material of a negative dielectric anisotropy.

A first optical element OD1 is adhered to an outer surface 10B of the first insulating substrate 10. The first optical element OD1 includes a first polarizer PL1 having a first polarization axis AX1. Other optical elements such as a retardation film may be disposed between the first polarizer PL1 and the first insulating substrate 10. A second optical element OD2 is adhered to an outer surface 20B of the second insulating substrate 20. The second optical element OD2 includes a second polarizer PL2 having a second polarization axis AX2. Other optical elements such as a retardation film may be disposed between the second polarizer PL2 and the second insulating substrate 20.

The first polarization axis AX1 and the second polarization axis AX2 are set in a cross-Nicol relationship in position in which the axes cross each other at right angles. For example, the first polarizer PL1 is disposed such that the first polarization axis AX1 is parallel to the first direction X, and the second polarizer PL2 is disposed such that the second polarization axis AX2 is parallel to the second direction Y. Alternatively, the second polarizer PL2 is disposed such that the second polarization axis AX2 is parallel to the first direction X, and the first polarizer PL1 is disposed such that the first polarization axis AX1 is parallel to the second direction Y.

Next, the operations of the liquid crystal display panel LPN having the above-described configuration will be explained.

The liquid crystal molecules LM of the liquid crystal layer LQ are initially aligned in a direction in which the longer axis is substantially parallel to the second direction Y, in the X-Y plane, in a state in which no voltage is applied to the liquid crystal layer LQ, i.e., a state in which no electric field is formed between the pixel electrode PE and the common electrodes CE (first common electrode CE1, second common electrode CE2, and third common electrode CE3) (OFF time).

In the OFF state, part of the light from the backlight unit BL is transmitted through the first polarizer PL1 and is made incident on the liquid crystal display panel LPN. The light incident on the liquid crystal display panel LPN is linearly polarized light orthogonal to the first polarization axis AX1 of the first polarizer PL1. The polarized state of the linearly polarized light hardly varies when the light passes through the liquid crystal display panel LPN in the OFF state. For this reason, the linearly polarized light transmitted through the liquid crystal display panel LPN is absorbed by the second polarizer PL2 in the cross-Nicol relationship in position with the first polarizer PL1 (black display).

In contrast, an electric field substantially parallel to the main surface of the substrate is formed between the pixel electrode PE and the second common electrode CE2, and an oblique field which is oblique to the main surface of the substrate is formed between the pixel electrode PE and the third common electrode CE3, in a state in which a voltage is applied to the liquid crystal layer LQ, i.e., a potential difference is formed between the pixel electrode PE and the common electrodes CE (ON time). The liquid crystal molecules LM are influenced by the electric fields between the pixel electrode PE and the common electrodes CE, and the aligned state of the molecules is varied. At the ON time, the alignment direction of the liquid crystal molecules LM is divided into a plurality of directions, at the position overlapping the pixel electrode PE, and domains are formed in the respective alignment directions. In other words, a plurality of domains are formed in each pixel PX. A transmissive region through which the backlight can be thereby transmitted is formed between the pixel electrode PE and the common electrodes CE, in the pixel PX.

In the ON state, the polarized state of the linearly polarized light incident on the liquid crystal display panel LPN is varied in accordance with the aligned state of the liquid crystal molecules LM when the light passes through the liquid crystal layer LQ. For this reason, at the ON time, at least part of the linearly polarized light passing through the liquid crystal layer LQ is transmitted through the second polarizer PL2 (white display). However, since the liquid crystal molecules LM are held in the initial alignment state at the position overlapping the pixel electrode PE and the common electrodes CE, the black display is performed similarly to the state at the OFF time.

At the ON time, the semiconductor layer SC of the switching element SW is opposed to the storage capacitance line C1 through the first insulating film 11 to hold the pixel potential written in each pixel for a certain period.

In the present embodiment, the fourth insulating film 14 has a greater thickness than the third insulating film 13. In other words, the third insulating film 13 has a thickness t3 along a third direction Z, as shown in FIG. 6. In contrast, the fourth insulating film 14 has a thickness t4 along the third direction Z. For example, the thickness t3 is 0.1 µm or more and less than 1.0 µm, and the thickness t4 is 1.0 µm or more and 3.0 µm or less.

In addition, the following relationship is met from the other viewpoint when the relative dielectric constant of the third insulating film 13 is represented by ∈3 and the relative dielectric constant of the fourth insulating film 14 is represented by ∈4.

$$t4 > (\in 4/\in 3)*t3$$

According to the present embodiment, the array substrate AR comprises the first common electrode CE1 on the side of the first insulating substrate 10 rather than each source line S, and also comprises the second main common electrode CA2, which corresponds to the second main common electrodes CAL2 and CAR2 in the above-explained example, on the side of the liquid crystal layer LQ rather than each source line S. Since the first common electrode CE1 and the second main common electrode CA2 are at the same potential, an equipotential surface is formed between the first common electrode CE1 and the second main common electrode CA2. Such an equipotential surface shields an undesirable leakage field extending from the source line S located between the first common electrode CE1 and the second main common electrode CA2 to the liquid crystal layer LQ.

In addition, the thickness t4 of the fourth insulating film 14 interposed between the source line S and the second common electrode CE2 is greater than the thickness t3 of the third insulating film 13 interposed between the source line S and the first common electrode CE1. Alternatively, when the relative dielectric constant of the third insulating film 13 is represented by ∈3 and the relative dielectric constant of the fourth insulating film 14 is represented by ∈4, the relationship t4>(∈4/∈3)*t3 is met. For this reason, the electric field from the source line S can easily be formed via the third insulating film 13 having a higher dielectric constant and a smaller thickness than the fourth insulating film 14. In other words, the electric field extending from the source line S to the liquid crystal layer LQ side through the fourth insulating film 14 can be suppressed and formation of the electric field extending from the source line S to the first common electrode CE1 through the third insulating film 13 can be promoted. For this reason, the influence of the undesired field in the region close to the source line S, of the transmissive region, can be reduced. The transmittance (or brightness) per pixel can be thereby enhanced. Display quality can be therefore enhanced.

In addition, the first common electrode CE1 is opposed to the gate line G. For this reason, the undesired leakage field extending from the gate line G to the liquid crystal layer LQ can be shielded. Therefore, the influence of the undesired field in the region close to the gate line G, of the transmissive region, can be reduced, and the display quality can be further improved.

In addition, the first common electrode CE1 of the common potential is interposed between the source line S1 and the semiconductor layer SC. For this reason, capacitive coupling between semiconductor layer SC and the source line S1 can be suppressed. In particular, capacitive coupling with the source line S1 can be suppressed on the second region SCD side of the semiconductor layer SC which is in contact with the pixel electrode PE. For this reason, the pixel potential can be maintained constantly irrespective of the electric potential of the video signal to be supplied to the source line S1. Deterioration of the display quality caused by image crosstalk can be suppressed in the pixels electrically connected with the same source line.

According to the present embodiment, the counter-substrate CT comprises the third common electrode CE3. The third common electrode CE3 is designed in a lattice shape to be opposed to the second common electrode CE2 and is set at the same potential as the second common electrode CE2. For this reason, the equipotential surface is formed between the second common electrode CE2 and the third common electrode CE3. Even if misalignment occurs between the array substrate AR and the counter-substrate CT, the equipotential surface can suppress occurrence of color mixture since the equipotential surface maintains the liquid crystal molecules LM in the initial alignment state at the ON time and the OFF time.

FIG. 7 is a graph showing a result of simulating a relationship of a relative brightness with a thickness ratio between the third insulating film 13 and the fourth insulating film 14. In FIG. 7, tendency of influences (image crosstalk and productivity) from the thickness ratio between the third insulating film 13 and the fourth insulating film 14 is further illustrated.

A lateral axis in FIG. 7 represents the logarithmic thickness ratio (t4/t3) where the thickness of the third insulating film 13 is denoted by t3 and the thickness of the fourth insulating film 14 is denoted by t4. A vertical axis in FIG. 7 represents the relative brightness. In addition, good and bad levels of the image crosstalk and high and low levels of the productivity are also illustrated on the right side of FIG. 7.

According to the simulation result, the tendency that the relative brightness is enhanced as the thickness ratio (t4/t3) becomes greater can be confirmed. This is because as the thickness t4 of the fourth insulating film 14 becomes greater as compared with the thickness t3 of the third insulating film 13, the influence of the leakage field from the source line S is reduced, and the liquid crystal molecules LM are aligned in a desired direction and contributes to the display.

In contrast, as the thickness t3 of the third insulating film 13 becomes smaller as compared with the thickness t4 of the fourth insulating film 14, the influence of the capacitive coupling between the source line S and the first common electrode CE1, which are opposed to each other via the third insulating film 13, ceases to be negligible and the image crosstalk tends to worsen.

In addition, formation of the excessively thick fourth insulating film 14 of an organic material tends to deteriorate the productivity since the consumption of the material is increased and the time required for curing becomes long. Furthermore, formation of the excessively thin third insulating film 13 of an inorganic material may cause short-circuit between the source line S and the first common electrode CE1 and tends to deteriorate the productivity.

The thickness ratio (t4/t3) should desirably be 1.5 or more and 10 or less, in consideration of the brightness enhancement effect achieved by increase in the thickness ratio (t4/t3) and the influence from the thickness ratio (t4/t3). More desirably, the thickness ratio (t4/t3) should be 3 or more and 6 or less by further considering the viewpoint of practical use.

Next, a modified example of the present embodiment will be described. In the following explanations, major differences are described, and constituent elements like or similar to those of the above-explained embodiment are denoted by the same reference numbers or symbols and are not described in detail.

FIG. 8 is a cross-sectional view schematically showing another sectional structure of the liquid crystal display panel LPN as cut along the C-D line in FIG. 2.

The configuration example shown in FIG. 8 is different from the configuration example in FIG. 6 with respect to a feature that the third common electrode of the counter-substrate CT is omitted. In the counter-substrate CT, the entire surface of the overcoat layer OC on the array substrate AR side is covered with the second alignment film AL2. In this configuration example, an electric field necessary to control alignment of the liquid crystal molecules is formed between the pixel electrode PE and the second common electrode CE2, at the ON time. In this configuration example, too, the same advantages as those of the above-described configuration example can be obtained.

According to the present embodiment, as described above, the liquid crystal display device capable of enhancing the display device and the substrate for the display device can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A liquid crystal display device, comprising:
a first substrate comprising a semiconductor layer including a first region and a second region, a first insulating film covering the semiconductor layer, a second insulating film covering the first insulating film, a gate line extended in a first direction between the first insulating film and the second insulating film to intersect the semiconductor layer, a third insulating film, a first common electrode formed between the second insulating film and the third insulating film, a source line which is extended in a second direction intersecting the first direction directly on the third insulating film and which is in contact with the first region through a first contact hole penetrating the first to third insulating films, a drain electrode which is formed on the third insulating film and which is in contact with the second region through a second contact hole penetrating the first to third insulating films, a fourth insulating film which covers the source line and the drain electrode and which has a thickness greater than a thickness of the third insulating film, a pixel electrode which includes a main pixel electrode extended in the second direction on the fourth insulating film and which is in contact with the drain electrode through a third contact hole penetrating the fourth insulating film, a second common electrode which includes a second main common electrode extended in the second direction on the fourth insulating film and opposed to the source line, and which has a same potential as the first common electrode, and a first alignment film covering the pixel electrode and the second common electrode;
a second substrate comprising a second alignment film opposed to the first alignment film; and
a liquid crystal layer held between the first substrate and the second substrate, wherein
the first common electrode is opposed to the source line, extended in the first direction over the source line, opposed to the gate line and the pixel electrode, and extended in the second direction over the gate line,
the first common electrode comprises a first opening portion and a second opening portion,
the first opening portion overlaps the first contact hole, and
the second opening portion overlaps the second contact hole.

2. The liquid crystal display device of claim 1, wherein the thickness of the fourth insulating film is 1.5 to 10 times as great as the thickness of the third insulating film.

3. The liquid crystal display device of claim 1, wherein each of the first to third insulating films is formed of an inorganic material, and the fourth insulating film is formed of an organic material.

4. The liquid crystal display device of claim 1, wherein the second substrate comprises a third common electrode which includes a third main common electrode extended in the second direction and opposed to the second main common electrode, which is covered with the second alignment film, and which has a same potential as the second common electrode.

5. The liquid crystal display device of claim 1, wherein the first common electrode is formed of a transparent conductive material.

6. The liquid crystal display device of claim 1, wherein the second common electrode is formed in a strip shape.

7. A liquid crystal display device, comprising:
a first substrate comprising a semiconductor layer including a first region and a second region, a first insulating film covering the semiconductor layer, a second insulating film covering the first insulating film, a gate line extended in a first direction between the first insulating film and the second insulating film to intersect the semiconductor layer, a third insulating film covering the second insulating film, a first common electrode formed between the second insulating film and the third insulating film, a source line which is extended in a second direction intersecting the first direction directly on the third insulating film and which is in contact with the first region through a first contact hole penetrating the first to third insulating films, a drain electrode which is formed on the third insulating film and which is in contact with the second region through a second contact hole penetrating the first to third insulating films, a fourth insulating film which covers the source line and the drain electrode, a pixel electrode which includes a main pixel electrode extended in the second direction on the fourth insulating film and which is in contact with the drain electrode through a third contact hole penetrating the fourth insulating film, a second common electrode which includes a second main common electrode extended in the second direction on the fourth insulating film and opposed to the source line, and which has a same potential as the first common electrode, and a first alignment film covering the pixel electrode and the second common electrode;
a second substrate comprising a second alignment film opposed to the first alignment film; and
a liquid crystal layer held between the first substrate and the second substrate,
a relationship $t4>(\in4/\in3)*t3$ being met where a thickness of the third insulating film is represented by t3, a relative dielectric constant of the third insulating film is represented by $\in3$, a thickness of the fourth insulating film is represented by t4, and a relative dielectric constant of the fourth insulating film is represented by $\in4$ wherein the first common electrode is opposed to the source line, extended in the first direction over the source line, opposed to the gate line and the pixel electrode, and extended in the second direction over the gate line, the first common electrode comprises a first opening portion and a second opening portion, the first opening portion overlaps the first contact hole, and the second opening portion overlaps the second contact hole.

8. The liquid crystal display device of claim 7, wherein the thickness of the fourth insulating film is 1.5 to 10 times as great as the thickness of the third insulating film.

9. The liquid crystal display device of claim 7, wherein each of the first to third insulating films is formed of an inorganic material, and the fourth insulating film is formed of an organic material.

10. The liquid crystal display device of claim 7, wherein the second substrate comprises a third common electrode which includes a third main common electrode extended in the second direction and opposed to the second main common electrode, which is covered with the second alignment film, and which has a same potential as the second common electrode.

11. A substrate for a display device, the substrate comprising:

a semiconductor layer;

a first insulating film covering the semiconductor layer;

a gate line extended in a first direction on the first insulating film to intersect the semiconductor layer;

a first storage capacitance line and a second storage capacitance line on the first insulating film;

a second insulating film covering the gate line, the first storage capacitance line and the second storage capacitance line;

a first common electrode formed on the second insulating film;

a third insulating film covering the first common electrode;

a source line which is extended in a second direction intersecting the first direction on the third insulating film and which is in contact with the semiconductor layer through a first contact hole penetrating the first to third insulating films; and a fourth insulating film which covers the source line and which has a thickness greater than a thickness of the third insulating film, wherein the gate line is located between the first storage capacitance line and the second storage capacitance line and is closer to the first storage capacitance line than to the second storage capacitance line, and the first common electrode is opposed to the source line, extended in the first direction over the source line, opposed to the gate line, the first storage capacitance line and the second storage capacitance line, and extended in the second direction over the first storage capacitance line and the second storage capacitance line.

12. The substrate of claim 11, wherein the semiconductor layer includes a first extended portion which is opposed to the source line and extended in the second direction, a second extended portion which is continuous with the first extended portion, opposed to the first storage capacitance line, and extended in the first direction, and a third extended portion which is continuous with the second extended portion and extended in the second direction.

13. The substrate of claim 12, further comprising a branch portion which is continuous with the gate line, wherein the first extended portion intersects the gate line and the branch portion.

14. The substrate of claim 12, further comprising a drain electrode between the third insulating film and the fourth insulating film, wherein the first common electrode comprises an opening portion, and the drain electrode is in contact with the third extended portion through the opening portion and a second contact hole penetrating the first to third insulating films, between the gate line and the first storage capacitance line.

15. The substrate of claim 14, further comprising a pixel electrode on the fourth insulating film, wherein the drain electrode is extended in the second direction from a position overlapping the second contact hole to a position opposed to the gate line, and the pixel electrode is in contact with the drain electrode through a third contact hole penetrating the fourth insulating film, at a position at which the drain electrode is opposed to the gate line.

16. The substrate of claim 15, wherein the pixel electrode comprises a main pixel electrode extended in the second direction and a sub pixel electrode extended in the first direction, and the sub-pixel electrode is in contact with the drain electrode through the third contact hole.

17. The substrate of claim 16, further comprising a second main common electrode which is extended in the second direction on the fourth insulating film, opposed to the source line, and has a same potential as the first common electrode, wherein the second main common electrode has a first width at a position at which the second main common electrode is aligned with the main pixel electrode and a second width at a position at which the second main common electrode is aligned with the sub-pixel electrode, and the second width is smaller than the first width.

18. The substrate of claim 11, wherein the second storage capacitance line includes a first portion extended in the first direction, and a second portion which is continuous with the first portion, opposed to the source line, and extended in the second direction toward the gate line.

* * * * *